United States Patent
Honke et al.

(10) Patent No.: US 9,896,781 B2
(45) Date of Patent: Feb. 20, 2018

(54) SILICON CARBIDE SINGLE-CRYSTAL SUBSTRATE, SILICON CARBIDE EPITAXIAL SUBSTRATE AND METHOD OF MANUFACTURING THEM

(71) Applicant: SUMITOMO ELECTRIC INDUSTRIES, LTD., Osaka-shi, Osaka (JP)

(72) Inventors: Tsubasa Honke, Itami (JP); Kyoko Okita, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 15/125,238

(22) PCT Filed: Feb. 9, 2015

(86) PCT No.: PCT/JP2015/053509
§ 371 (c)(1),
(2) Date: Sep. 12, 2016

(87) PCT Pub. No.: WO2015/146320
PCT Pub. Date: Oct. 1, 2015

(65) Prior Publication Data
US 2017/0073837 A1      Mar. 16, 2017

(30) Foreign Application Priority Data

Mar. 28, 2014   (JP) .................. 2014-068308

(51) Int. Cl.
*B32B 3/00*      (2006.01)
*C30B 25/18*     (2006.01)
(Continued)

(52) U.S. Cl.
CPC .......... *C30B 25/186* (2013.01); *B24B 37/042* (2013.01); *C23C 16/325* (2013.01);
(Continued)

(58) Field of Classification Search
CPC .......... H01L 21/0243; H01L 21/02378; H01L 21/02433; H01L 21/02587;
(Continued)

(56) References Cited

U.S. PATENT DOCUMENTS

| | | |
|---|---|---|
| 2010/0080956 A1 | 4/2010 | Fujimoto et al. |
| 2012/0034395 A1 | 2/2012 | Goto |
| 2013/0256700 A1 | 10/2013 | Ishibashi |

FOREIGN PATENT DOCUMENTS

| | | |
|---|---|---|
| JP | 2005-39155 A | 2/2005 |
| JP | 2008-290898 A | 12/2008 |

(Continued)

*Primary Examiner* — Elizabeth E Mulvaney
(74) *Attorney, Agent, or Firm* — Drinker Biddle & Reath LLP

(57) ABSTRACT

A silicon carbide single-crystal substrate includes a first main surface and a second main surface opposite to the first main surface. The first main surface has a maximum diameter of not less than 100 mm. The first main surface includes a first central region excluding a region within 3 mm from an outer circumference of the first main surface. When the first central region is divided into first square regions each having a side of 250 μm, each of the first square regions has an arithmetic average roughness (Sa) of less than 0.2 nm, and an oxygen concentration in each of the first square regions is not less than 5 atom % and less than 20 atom %.

11 Claims, 7 Drawing Sheets

(51) Int. Cl.
  *C30B 25/20* (2006.01)
  *C30B 29/36* (2006.01)
  *H01L 21/02* (2006.01)
  *B24B 37/04* (2012.01)
  *C23C 16/32* (2006.01)

(52) U.S. Cl.
  CPC .............. *C30B 25/20* (2013.01); *C30B 29/36* (2013.01); *H01L 21/0243* (2013.01); *H01L 21/0262* (2013.01); *H01L 21/02378* (2013.01); *H01L 21/02433* (2013.01); *H01L 21/02529* (2013.01); *H01L 21/02587* (2013.01); *H01L 21/02658* (2013.01)

(58) Field of Classification Search
  CPC ......... H01L 21/02529; H01L 21/02658; B24B 37/042; C23C 16/42; C23C 16/325; C30B 25/20; C30B 25/36; C30B 25/186
  See application file for complete search history.

(56) References Cited

FOREIGN PATENT DOCUMENTS

| | | | |
|---|---|---|---|
| JP | 2009-105127 A | 5/2009 | |
| JP | 2009-135127 A | 6/2009 | |
| JP | 2012-035188 A | 2/2012 | |
| JP | 2013-529389 A | 7/2013 | |
| JP | 2013-212951 A | 10/2013 | |
| WO | WO-2011/149906 A1 | 12/2011 | | ent

SILICON CARBIDE SINGLE-CRYSTAL SUBSTRATE, SILICON CARBIDE EPITAXIAL SUBSTRATE AND METHOD OF MANUFACTURING THEM

TECHNICAL FIELD

The present invention relates to silicon carbide single-crystal substrates, silicon carbide epitaxial substrates and methods of manufacturing them, and particularly relates to a silicon carbide single-crystal substrate including a main surface having a maximum diameter of not less than 100 mm, a silicon carbide epitaxial substrate and a method of manufacturing them.

BACKGROUND ART

In recent years, silicon carbide has been increasingly employed as a material for a semiconductor device such as a MOSFET (Metal Oxide Semiconductor Field Effect Transistor) in order to allow a higher breakdown voltage, lower loss and the use in a high-temperature environment and the like of the semiconductor device. Silicon carbide is a wide band gap semiconductor having a band gap wider than that of silicon which has been conventionally and widely used as a material for a semiconductor device. By employing the silicon carbide as a material for a semiconductor device, therefore, a higher breakdown voltage, lower on-resistance and the like of the semiconductor device can be achieved. A semiconductor device made of silicon carbide is also advantageous in that performance degradation is small when used in a high-temperature environment as compared to a semiconductor device made of silicon.

A silicon carbide substrate used to manufacture a semiconductor device is formed by slicing a silicon carbide ingot formed by a sublimation method, for example. Japanese Patent Laying-Open No. 2009-105127 (PTD 1) describes a method of manufacturing a silicon carbide wafer. According to this method of manufacturing a silicon carbide wafer, a surface of a workpiece sliced and cut from an ingot of SiC is ground and polished, so that the surface of the workpiece is smoothed into a mirror surface. After the surface of the workpiece is smoothed, a backside surface of the workpiece is ground.

CITATION LIST

Patent Document

PTD 1: Japanese Patent Laying-Open No. 2009-105127

SUMMARY OF INVENTION

Technical Problem

However, the silicon carbide substrate manufactured by the method described in Japanese Patent Laying-Open No. 2009-105127 is not always held stably by a vacuum adsorption chuck while a device process is performed.

The present invention has been made to solve the problem described above, and an object of the present invention is to provide a silicon carbide single-crystal substrate, a silicon carbide epitaxial substrate and a method of manufacturing them capable of reducing vacuum adsorption failures.

Solution to Problem

A silicon carbide single-crystal substrate according to the present invention includes a first main surface and a second main surface opposite to the first main surface. The first main surface has a maximum diameter of not less than 100 mm. The first main surface includes a first central region excluding a region within 3 mm from an outer circumference of the first main surface. When the first central region is divided into first square regions each having a side of 250 each of the first square regions has an arithmetic average roughness (Sa) of less than 0.2 nm, and an oxygen concentration in each of the first square regions is not less than 5 atom % and less than 20 atom %.

A method of manufacturing a silicon carbide single-crystal substrate according to the present invention includes the following steps. A silicon carbide substrate including a first main surface and a second main surface opposite to the first main surface is prepared by slicing a silicon carbide single crystal. A layer including a process-damaged layer formed on the first main surface side of the silicon carbide substrate is removed. After the process-damaged layer is removed, the first main surface includes a first central region excluding a region within 3 mm from an outer circumference of the first main surface. Oxygen concentration in the first central region is measured. The first main surface has a maximum diameter of not less than 100 mm. In the step of removing a layer including a process-damaged layer, not less than 1.5 µm of the layer including the process-damaged layer is removed. When the first central region is divided into first square regions each having a side of 250 µm, an oxygen concentration in each of the first square regions is not less than 5 atom % and less than 20 atom %.

Advantageous Effects of Invention

According to the present invention, a silicon carbide single-crystal substrate, a silicon carbide epitaxial substrate and a method of manufacturing them capable of reducing vacuum adsorption failures can be provided.

DESCRIPTION OF EMBODIMENTS

Figure 1:
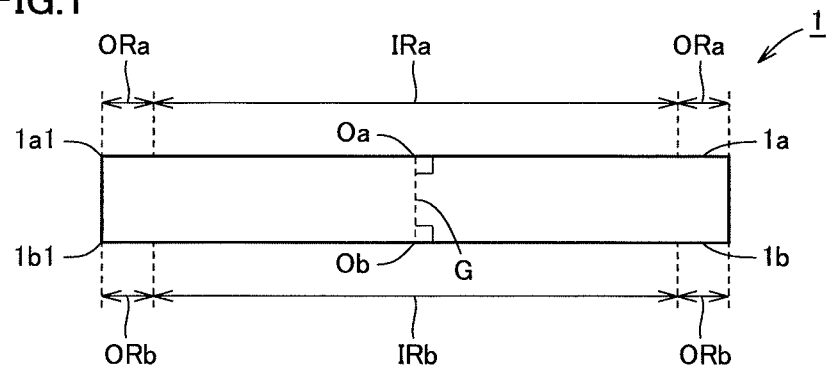
FIG. 1 is a schematic cross-sectional view schematically showing the structure of a silicon carbide single-crystal substrate 1 according to a first embodiment of the present invention.

Description of Embodiments of the Invention of the Present Application

Embodiments of the present invention are described below with reference to the drawings. In the following drawings, the same or corresponding parts are designated by the same reference numbers and are not described repeatedly. In the present specification, an individual orientation is represented by [ ], a group orientation is represented by < >, an individual plane is represented by ( ), and a group plane is represented by { }. In addition, a negative crystallographic index is normally expressed by putting "–" (bar) above a numeral, but is expressed by putting a negative sign before the numeral in the present specification.

The present inventors conducted a diligent study of a cause for the occurrence of a vacuum adsorption failure of a substrate, and conceived of the present invention based on the following findings.

A vacuum adsorption failure of a substrate may result from deformation of the shape of the substrate. The inventors took note of non-uniform roughness of a backside surface of a substrate after an epitaxial layer had been formed on a surface of the substrate. One of the causes for the non-uniform roughness of the backside surface of the substrate is believed to be that a process-damaged layer (damaged layer) formed on the backside surface of the substrate during slicing of an ingot or grinding of the substrate partially remains, and this process-damaged layer is thermally sublimated while the epitaxial layer is formed. The non-uniform roughness of the backside surface of the substrate causes stress to occur in the substrate, resulting in deformation of the substrate. If an epitaxial layer is formed on a surface of the substrate in a deformed state, the backside surface of the substrate is sublimated near its outer circumference, or the epitaxial layer is conversely formed on the backside surface of the substrate near its outer circumference, resulting in further deformation of the substrate. It is believed that this causes the occurrence of a vacuum adsorption failure of the substrate. It is believed that as the maximum diameter of a main surface of the substrate increases (not less than 100 mm, for example), the amount of warpage also increases, and thus a vacuum adsorption failure of the substrate is more likely to occur.

Thus, the inventors believed that by performing chemical mechanical polishing on the backside surface on which the process-damaged layer has been formed to thereby remove not less than 1.5 μm of a layer including the process-damaged layer, the process-damaged layer formed on the backside surface can be substantially completely removed, thereby suppressing the roughness of the backside surface of the substrate during the formation of the epitaxial layer. In addition, taking note of the fact that the process-damaged layer included a lot of oxygen, the inventors believed that by measuring oxygen concentration in the backside surface of the substrate, it can be evaluated how much of the process-damaged layer is remaining on the backside surface of the substrate.

(1) A silicon carbide single-crystal substrate 1 according to an embodiment includes a first main surface 1b and a second main surface 1a opposite to first main surface 1b. First main surface 1b has a maximum diameter of not less than 100 mm. First main surface 1b includes a first central region IRb excluding a region ORb within 3 mm from an outer circumference of first main surface 1b. When first central region IRb is divided into first square regions 4b each having a side of 250 μm, each of first square regions 4b has an arithmetic average roughness (Sa) of less than 0.2 nm, and an oxygen concentration in each of first square regions 4b is not less than 5 atom % and less than 20 atom %.

According to silicon carbide single-crystal substrate 1 in accordance with (1) above, each of first square regions 4b has an arithmetic average roughness (Sa) of less than 0.2 nm, and an oxygen concentration in each of first square regions 4b is not less than 5 atom % and less than 20 atom %. Accordingly, the roughness of first main surface 1b of silicon carbide single-crystal substrate 1 can be suppressed during epitaxial layer growth. As a result, vacuum adsorption failures of silicon carbide single-crystal substrate 1 can be reduced.

(2) Preferably, in silicon carbide single-crystal substrate 1 according to (1) above, second main surface 1a includes a second central region IRa excluding a region ORa within 3 mm from an outer circumference of second main surface 1a. When second central region IRa is divided into second square regions 4a each having a side of 250 μm, each of second square regions 4a has an arithmetic average roughness (Sa) of less than 0.2 nm. The arithmetic average roughness (Sa) of both first main surface 1b and second main surface 1a of silicon carbide single-crystal substrate 1 can be reduced, thereby suppressing further warpage and deterioration of TTV of silicon carbide single-crystal substrate 1.

(3) Preferably, in silicon carbide single-crystal substrate 1 according to (1) or (2) above, a mechanical polishing scratch is not formed on first main surface 1b. Accordingly, the roughness of first main surface 1b of silicon carbide single-crystal substrate 1 can be further reduced.

(4) A silicon carbide epitaxial substrate 3 according to an embodiment includes silicon carbide single-crystal substrate 1 according to any one of (1) to (3) above, and a silicon carbide epitaxial layer 2. Silicon carbide epitaxial layer 2 is provided on second main surface 1a of silicon carbide single-crystal substrate 1. Each of first square regions 4b has an arithmetic average roughness (Sa) of less than 1.5 nm. Accordingly, vacuum adsorption failures of silicon carbide epitaxial substrate 3 can be reduced. If an abnormally grown portion such as particles exists on backside surface 1b of silicon carbide single-crystal substrate 1, "each of first square regions 4b on backside surface 1b of silicon carbide single-crystal substrate 1 has an arithmetic average roughness (Sa) of less than 1.5 nm" means that each of first square regions 4b excluding first square region or regions 4b where the abnormally grown portion exists has an arithmetic average roughness (Sa) of less than 1.5 nm. The abnormally grown portion means, for example, a portion having a width of not less than 0.1 μm in a direction along a direction parallel to backside surface 1b and a height of not less than 1 μm in a direction along a direction perpendicular to backside surface 1b.

(5) A method of manufacturing a silicon carbide single-crystal substrate 1 according to an embodiment includes the following steps. A silicon carbide substrate 5 including a first main surface 1b and a second main surface 1a opposite to first main surface 1b is prepared by slicing a silicon carbide single crystal. A layer 6b including a process-damaged layer 6b1 formed on the first main surface 1b side of silicon carbide substrate 5 is removed. After process-damaged layer 6b1 is removed, first main surface 1b includes a first central region IRb excluding a region within 3 mm from an outer circumference of first main surface 1b. Oxygen concentration in first central region IRb is measured. First main surface 1b has a maximum diameter of not less than 100 mm. In the step of removing a layer 6b including a process-damaged layer 6b1, not less than 1.5 μm of layer 6b including process-damaged layer 6b1 is removed. When first central region IRb is divided into first square regions 4b each having a side of 250 μm, an oxygen concentration in each of first square regions 4b is not less than 5 atom % and less than 20 atom %. Accordingly, the roughness of first main surface 1b of silicon carbide single-crystal substrate 1 can be suppressed during epitaxial layer growth. As a result, vacuum adsorption failures of silicon carbide single-crystal substrate 1 can be reduced.

(6) Preferably, in the method of manufacturing a silicon carbide single-crystal substrate 1 according to (5) above, each of first square regions 4b has an arithmetic average roughness (Sa) of less than 0.2 nm. The arithmetic average roughness (Sa) of both first main surface 1b and second main surface 1a of silicon carbide single-crystal substrate 1 can be reduced, thereby suppressing further warpage and deterioration of TTV of silicon carbide single-crystal substrate 1.

(7) Preferably, in the method of manufacturing a silicon carbide single-crystal substrate 1 according to (5) or (6) above, the step of removing a layer 6b including a process-damaged layer 6b1 includes the step of performing chemical mechanical polishing on first main surface 1b. Accordingly, the arithmetic average roughness (Sa) of first main surface 1b of silicon carbide single-crystal substrate 1 can be effectively reduced.

(8) Preferably, in the method of manufacturing a silicon carbide single-crystal substrate 1 according to (7) above, the step of performing chemical mechanical polishing on first main surface 1b includes the steps of performing first chemical mechanical polishing at a first polishing rate, and after the step of performing first chemical mechanical polishing, performing second chemical mechanical polishing at a second polishing rate slower than the first polishing rate. When the polishing rate is fast, silicon carbide single-crystal substrate 1 can be polished in a short period of time as compared to when the polishing rate is slow, but it is difficult to sufficiently reduce the arithmetic average roughness (Sa) after the polishing. Thus, a large part of the process-damaged layer is initially removed in a short period of time at the relatively fast first polishing rate, then first main surface 1b of silicon carbide single-crystal substrate 1 is polished at the second polishing rate slower than the first polishing rate, thereby reducing the final arithmetic average roughness (Sa) of first main surface 1b while shortening the overall polishing time.

(9) Preferably, in the method of manufacturing a silicon carbide single-crystal substrate 1 according to any one of (5) to (8) above, second main surface 1a includes a second central region IRa excluding a region within 3 mm from an outer circumference of second main surface 1a. When second central region IRa is divided into second square regions 4a each having a side of 250 μm, each of second square regions 4a has an arithmetic average roughness (Sa) of less than 0.2 nm. The arithmetic average roughness (Sa) of both first main surface 1b and second main surface 1a of silicon carbide single-crystal substrate 1 can be reduced, thereby suppressing further warpage and deterioration of TTV of silicon carbide single-crystal substrate 1.

(10) Preferably, in the method of manufacturing a silicon carbide single-crystal substrate 1 according to any one of (5) to (9) above, a mechanical polishing scratch is not formed on first main surface 1b. Accordingly, the roughness of first main surface 1b of silicon carbide single-crystal substrate 1 can be further reduced.

(11) In a method of manufacturing a silicon carbide epitaxial substrate according to an embodiment, silicon carbide single-crystal substrate 1 is prepared by the method of manufacturing a silicon carbide single-crystal substrate 1 according to any one of (5) or (10) above. A silicon carbide epitaxial layer 2 is formed on second main surface 1a of silicon carbide single-crystal substrate 1. After the step of forming a silicon carbide epitaxial layer 2, each of first square regions 4b has an arithmetic average roughness (Sa) of less than 1.5 nm. Accordingly, vacuum adsorption failures of silicon carbide epitaxial substrate 3 can be reduced. If an abnormally grown portion such as particles exists on backside surface 1b of silicon carbide single-crystal substrate 1, "each of first square regions 4b on backside surface 1b of silicon carbide single-crystal substrate 1 has an arithmetic average roughness (Sa) of less than 1.5 nm" means that each of first square regions 4b excluding first square region or regions 4b where the abnormally grown portion exists has an arithmetic average roughness (Sa) of less than 1.5 nm.

Details of Embodiments of the Invention of the Present Application

First Embodiment

First, the configuration of a silicon carbide substrate according to a first embodiment of the present invention is described with reference to FIGS. 1 to 3.

Figure 2:
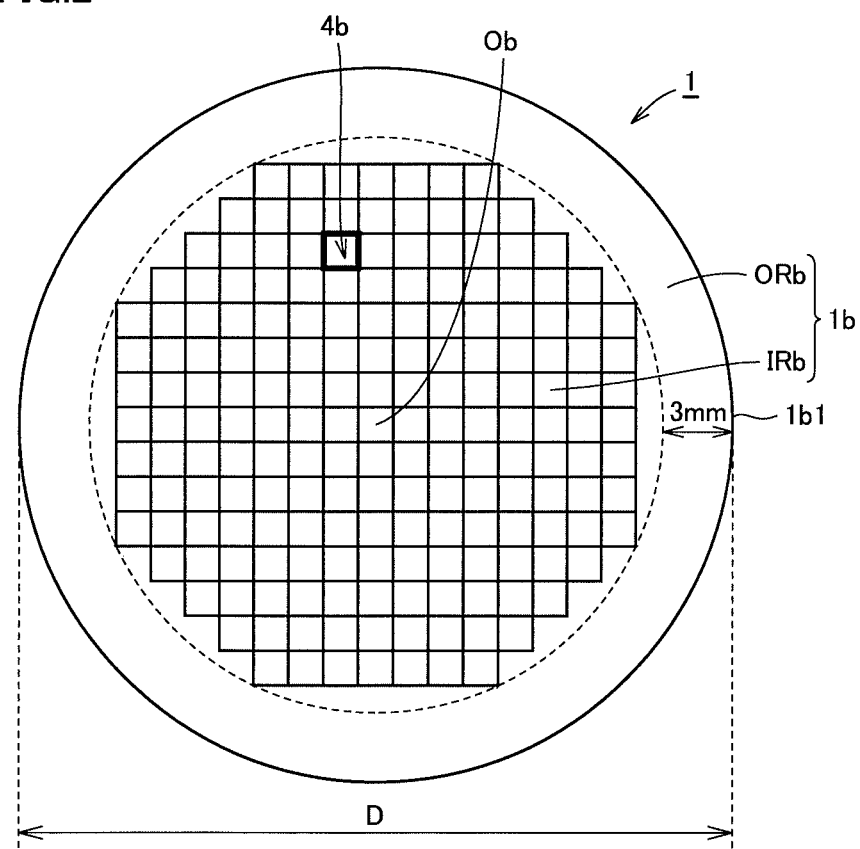
FIG. 2 is a schematic plan view schematically showing the structure of a backside surface 1b of silicon carbide single-crystal substrate 1 according to the first embodiment of the present invention.

Referring to FIGS. 1 and 2, a silicon carbide single-crystal substrate 1 according to the first embodiment has a first main surface 1b (backside surface 1b) and a second main surface 1a (surface 1a) opposite to first main surface 1b. Surface 1a is a surface on which an epitaxial layer is to be formed in a semiconductor manufacturing process using silicon carbide single-crystal substrate 1. Backside surface 1b is a surface on which a backside electrode is to be formed in the case of a vertical semiconductor device, for example. Silicon carbide single-crystal substrate 1 is made of a material including hexagonal silicon carbide having a polytype of 4H, for example.

Surface 1a of silicon carbide single-crystal substrate 1 may be a {0001} plane, or a plane having an off angle of about not more than 10° relative to the {0001} plane. Specifically, surface 1a of silicon carbide single-crystal substrate 1 may be a (0001) plane or a (000-1) plane, or a plane having an off angle of about not more than 10° relative to the (0001) plane or a plane having an off angle of about not more than 10° relative to the (000-1) plane.

Each of backside surface 1b and surface 1a of silicon carbide single-crystal substrate 1 has a maximum diameter D of not less than 100 mm, preferably not less than 150 mm. Backside surface 1b is formed of a first outer circumferential region ORb within 3 mm from an outer circumference 1b1 toward a center Ob of backside surface 1b, and a first central region IRb enclosed by first outer circumferential region ORb. Stated another way, backside surface 1b includes first outer circumferential region ORb within 3 mm from outer circumference 1b1, and first central region IRb excluding first outer circumferential region ORb within 3 mm from outer circumference 1b1. Center Ob of backside surface 1b is, if backside surface 1b is a circle, a center of the circle. If backside surface 1b is not a circle, center Ob of backside surface 1b is defined as a point of intersection of backside surface 1b and a straight line passing through a center of gravity G of silicon carbide single-crystal substrate 1 and being parallel to the normal of backside surface 1b.

Referring to FIG. 2, it is assumed that first central region IRb of backside surface 1b is divided into imaginary first square regions 4b each having a side of 250 µm. First central region IRb has satisfactory arithmetic average roughness and exhibits low oxygen concentration in all the regions. Specifically, each of first square regions 4b has an arithmetic average roughness (Sa) of less than 0.2 nm, and an oxygen concentration in each of first square regions 4b is not less than 5 atom % and less than 20 atom %. Preferably, each of first square regions 4b has an arithmetic average roughness (Sa) of less than 0.15 nm, more preferably less than 0.1 nm. Preferably, each of first square regions 4b has an oxygen concentration of not less than 5 atom % and less than 15 atom %, more preferably not less than 5 atom % and less than 10 atom %. The arithmetic average roughness (Sa) is a three-dimensionally expanded parameter of a two-dimensional arithmetic average roughness (Ra), and is defined as the following formula:

$$Sa = \frac{1}{A}\int\int_A |Z(x,y)|dxdy \qquad \text{[Mathematical 1]}$$

The arithmetic average roughness (Sa) can be measured, for example, by a white light interferometric microscope (manufactured by Nikon Corporation: BW-D507). A measurement area of the arithmetic average roughness (Sa) by the white light interferometric microscope is, for example, a square region having a side of 250 µm. The oxygen concentration can be measured by ESCA (Electron Spectroscopy for Chemical Analysis).

Figure 3:
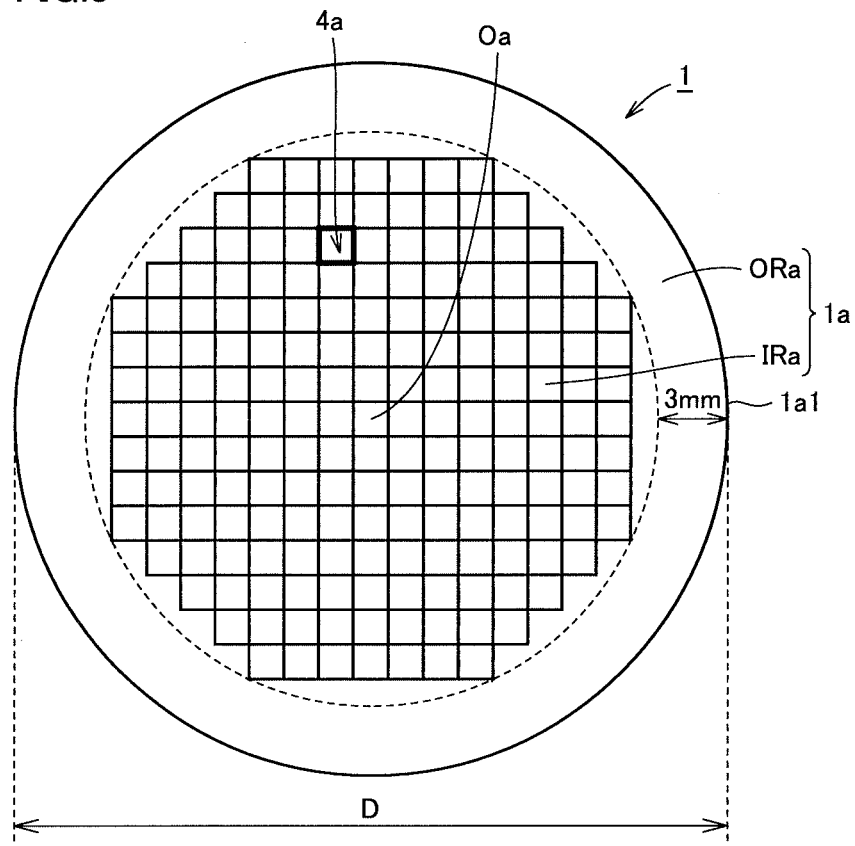
FIG. 3 is a schematic plan view schematically showing the structure of a surface 1a of silicon carbide single-crystal substrate 1 according to the first embodiment of the present invention.

Referring to FIGS. 1 and 3, surface 1a of silicon carbide single-crystal substrate 1 is formed of a second outer circumferential region ORa within 3 mm from an outer circumference 1a1 toward a center Oa of surface 1a, and a second central region IRa enclosed by second outer circumferential region ORa. Stated another way, surface 1a includes second outer circumferential region ORa within 3 mm from outer circumference 1a1, and second central region IRa excluding second outer circumferential region ORa within 3 mm from outer circumference 1a1. Center Oa of surface 1a is, if surface 1a is a circle, a center of the circle. If surface 1a is not a circle, center Oa of surface 1a is defined as a point of intersection of surface 1a and a straight line passing through center of gravity G of silicon carbide single-crystal substrate 1 and being parallel to the normal of surface 1a. Preferably, a mechanical polishing scratch is not formed on backside surface 1b.

Referring to FIG. 3, it is assumed that second central region IRa of surface 1a is divided into imaginary second square regions 4a each having a side of 250 µm. Preferably, second central region IRa has satisfactory arithmetic average roughness and exhibits low oxygen concentration in all the regions. Specifically, each of second square regions 4a preferably has an arithmetic average roughness (Sa) of less than 0.2 nm. In addition, an oxygen concentration in each of second square regions 4a is preferably not less than 5 atom % and less than 20 atom %. Preferably, each of second square regions 4a has an arithmetic average roughness (Sa) of less than 0.15 nm, more preferably less than 0.1 nm. Preferably, an oxygen concentration in each of second square regions 4a is not less than 5 atom % and less than 15 atom %, more preferably not less than 5 atom % and less than 10 atom %.

Next, the function and effect of silicon carbide single-crystal substrate 1 according to the first embodiment will be described.

According to silicon carbide single-crystal substrate 1 in accordance with the first embodiment, each of first square regions 4b has an arithmetic average roughness (Sa) of less than 0.2 nm, and an oxygen concentration in each of first square regions 4b is not less than 5 atom % and less than 20 atom %. Accordingly, the roughness of backside surface 1b of silicon carbide single-crystal substrate 1 can be suppressed during epitaxial layer growth. As a result, vacuum adsorption failures of silicon carbide single-crystal substrate 1 can be reduced.

In addition, according to silicon carbide single-crystal substrate 1 in accordance with the first embodiment, surface 1a includes second central region IRa excluding region ORa within 3 mm from the outer circumference. When second central region IRa is divided into second square regions 4a each having a side of 250 µm, each of second square regions 4a has an arithmetic average roughness (Sa) of less than 0.2 nm. The arithmetic average roughness (Sa) of both backside surface 1b and surface 1a of silicon carbide single-crystal substrate 1 can be reduced, thereby suppressing further warpage and deterioration of TTV of silicon carbide single-crystal substrate 1.

Furthermore, according to silicon carbide single-crystal substrate 1 in accordance with the first embodiment, a mechanical polishing scratch is not formed on backside surface 1b. Accordingly, the roughness of backside surface 1b of silicon carbide single-crystal substrate 1 can be further reduced.

Second Embodiment

Next, the configuration of a silicon carbide epitaxial substrate according to a second embodiment of the present invention is described.

Figure 4:
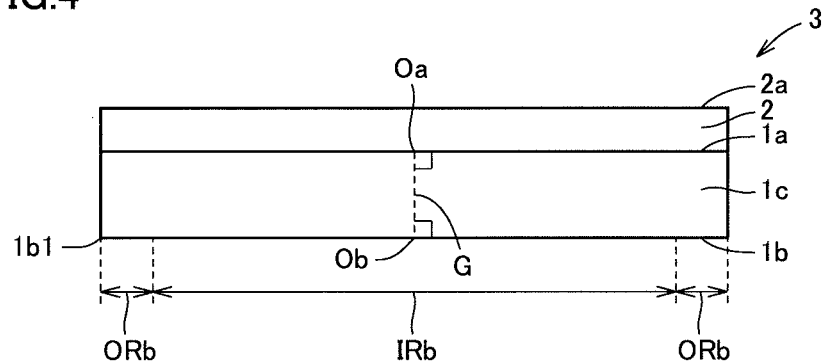
FIG. 4 is a schematic cross-sectional view schematically showing the structure of a silicon carbide epitaxial substrate 3 according to a second embodiment of the present invention.

Referring to FIG. 4, a silicon carbide epitaxial substrate 3 according to the second embodiment mainly has silicon carbide single-crystal substrate 1 described in the first embodiment, and a silicon carbide epitaxial layer 2 provided on surface 1a of silicon carbide single-crystal substrate 1. Silicon carbide epitaxial layer 2 includes an impurity such as nitrogen, and has n type conductivity. An impurity concentration in silicon carbide epitaxial layer 2 may be lower than an impurity concentration in silicon carbide single-crystal substrate 1. Silicon carbide epitaxial layer 2 has a thickness of 10 μm, for example.

When silicon carbide epitaxial layer 2 is formed on surface 1a of silicon carbide single-crystal substrate 1, the arithmetic average roughness (Sa) of backside surface 1b of silicon carbide single-crystal substrate 1 increases. Referring back to FIG. 2, in a state where silicon carbide epitaxial layer 2 has been formed on surface 1a of silicon carbide single-crystal substrate 1, each of first square regions 4b on backside surface 1b of silicon carbide single-crystal substrate 1 has an arithmetic average roughness (Sa) of less than 1.5 nm. Preferably, each of first square regions 4b has an arithmetic average roughness (Sa) of less than 1.0 nm, more preferably less than 0.5 nm. If an abnormally grown portion such as particles exists on backside surface 1b of silicon carbide single-crystal substrate 1, the arithmetic average roughness (Sa) of first square region 4b is measured excluding first square region or regions 4b including the abnormally grown portion.

Silicon carbide epitaxial substrate 3 according to the second embodiment includes silicon carbide single-crystal substrate 1 according to the first embodiment, and silicon carbide epitaxial layer 2. Silicon carbide epitaxial layer 2 is provided on second main surface 1a of silicon carbide single-crystal substrate 1. Each of first square regions 4b has an arithmetic average roughness (Sa) of less than 1.5 nm. Accordingly, vacuum adsorption failures of silicon carbide epitaxial substrate 3 can be reduced.

Third Embodiment

Next, a method of manufacturing silicon carbide single-crystal substrate 1 according to a third embodiment of the present invention is described.

First, an ingot made of silicon carbide single crystal is manufactured by a sublimation-recrystallization method, for example. Specifically, a seed crystal made of silicon carbide single crystal and source material powders made of silicon carbide polycrystal are inserted into a crucible (not shown) made of graphite, for example. Then, the crucible in which the source material powders have been placed is heated to sublimate the source material powders to produce sublimation gas, and the sublimation gas is recrystallized on the seed crystal. During the sublimation of silicon carbide, the recrystallization takes place with an impurity such as nitrogen being introduced into the crucible. The heating of the crucible is stopped at a point in time when the silicon carbide single crystal of a desired size has grown on the seed crystal. The silicon carbide single crystal is removed from the crucible.

Figure 5:
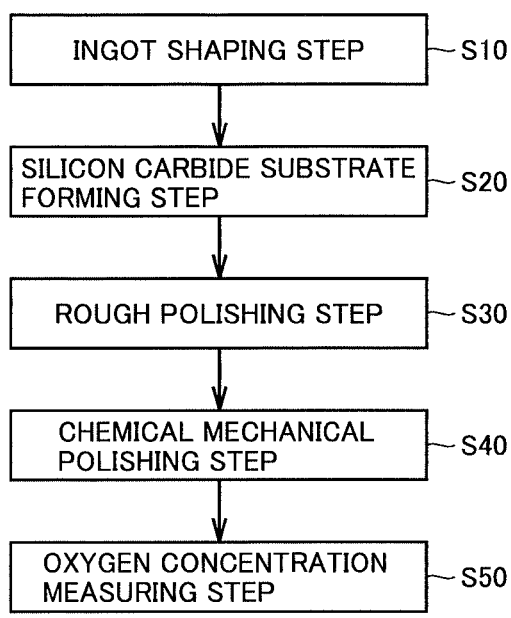
FIG. 5 is a flow diagram schematically showing a method of manufacturing silicon carbide single-crystal substrate 1 according to a third embodiment of the present invention.
Figure 6:
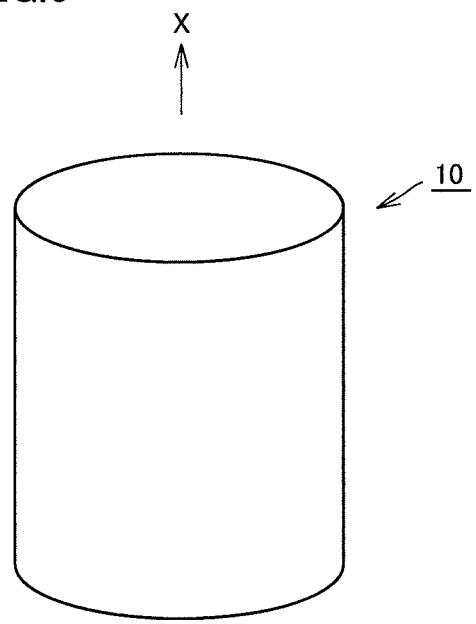
FIG. 6 is a schematic diagram schematically showing a first step of the method of manufacturing silicon carbide single-crystal substrate 1 according to the third embodiment of the present invention.

Then, an ingot shaping step (S10: FIG. 5) is performed. Referring to FIG. 6, the silicon carbide single crystal removed from the crucible is processed into an ingot 10 having a cylindrical shape, for example. Crystal growth of hexagonal silicon carbide can be advanced while the occurrence of defects is suppressed, by growing the hexagonal silicon carbide in a <0001> direction. It is thus preferable to fabricate ingot 10 having a longitudinal direction x corresponding to the <0001> direction.

Figure 7:
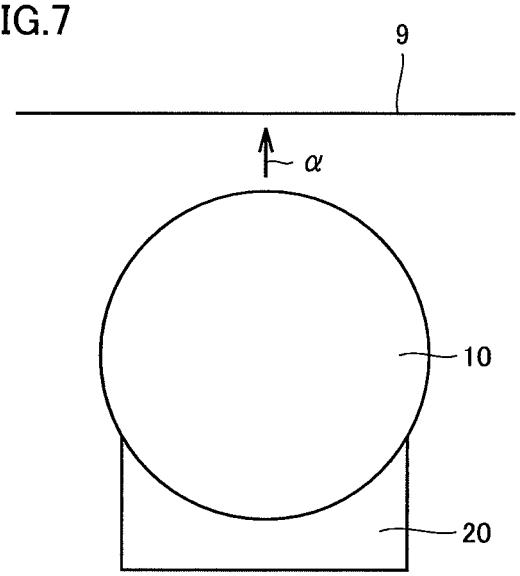
FIG. 7 is a schematic cross-sectional view schematically showing a second step of the method of manufacturing silicon carbide single-crystal substrate 1 according to the third embodiment of the present invention.
Figure 8:
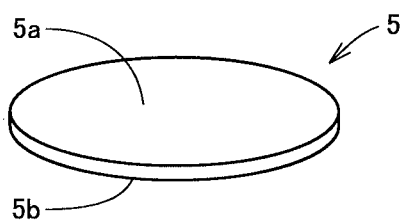
FIG. 8 is a schematic diagram schematically showing a third step of the method of manufacturing silicon carbide single-crystal substrate 1 according to the third embodiment of the present invention.

Then, a silicon carbide substrate forming step (S20: FIG. 5) is performed. Specifically, ingot 10 obtained in the above step (S10) is cut to fabricate a plurality of silicon carbide substrates. Specifically, referring to FIG. 7, first, columnar (cylindrical) ingot 10 fabricated is disposed such that its side surfaces are partially supported by a support mount 20. Then, a wire 9 runs in a direction (horizontal direction in FIG. 7) along a direction of the diameter of ingot 10 while ingot 10 approaches wire 9 along a cutting direction α perpendicular to the running direction, causing wire 9 and ingot 10 to come into contact with each other. Ingot 10 is cut by continuing to move along cutting direction α. In this manner, a silicon carbide substrate 5 (FIG. 8) including a backside surface 5b (first main surface 5b) and a surface 5a (second main surface 1a) opposite to backside surface 5b is prepared by slicing silicon carbide single-crystal ingot 10. Each of surface 5a and backside surface 5b of silicon carbide substrate 5 has a maximum diameter of not less than 100 mm.

Then, a rough polishing step (S30: FIG. 5) is performed. Specifically, a grinding process, a polishing process and the like are performed on each of backside surface 5b and surface 5a of silicon carbide substrate 5, to reduce the roughness of the cut surfaces formed in the above step (S20) (namely, surface 5a and backside surface 5b). In the grinding processing, a diamond grindstone is used as a tool, and the grindstone is set to face silicon carbide substrate 5 and rotated to cut into it at a constant speed, and thereby removes a portion of the surface of the substrate. Accordingly, surface 5a and backside surface 5b are planarized by removing its unevenness, and the thickness of silicon carbide substrate 5 is adjusted. In the polishing processing, diamond or the like can be used as abrasive grains. As a surface plate, a surface plate made of metal such as iron, copper, tin, a tin alloy, or the like, a composite surface plate made of metal and resin, or a polishing cloth can be used. Using a hard metal surface plate can improve a rate. Using a soft surface plate can reduce the surface roughness.

Figure 9:
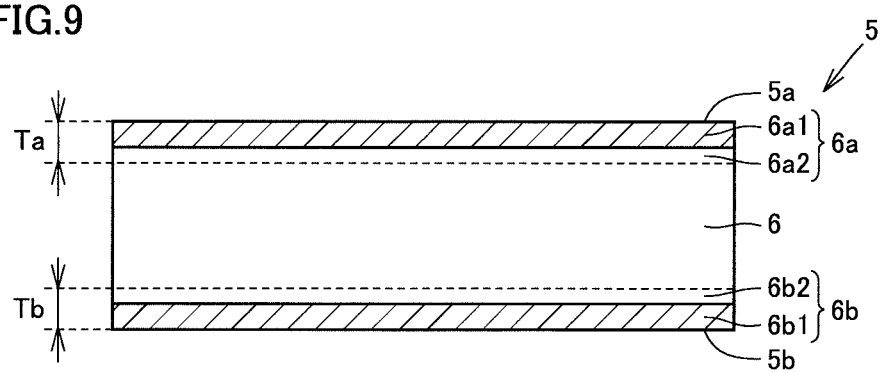
FIG. 9 is a schematic plan view schematically showing the third step of the method of manufacturing silicon carbide single-crystal substrate 1 according to the third embodiment of the present invention.

Referring to FIG. 9, after silicon carbide single-crystal ingot 10 is sliced in the above step (S20), or after the grinding step and the polishing step are performed on each of surface 5a and backside surface 5b of silicon carbide substrate 5 in the above step (S30), process-damaged layers 6a1 and 6a2 are formed on each of surface 5a and backside surface 5b of silicon carbide substrate 5.

Then, a chemical mechanical polishing step (S40: FIG. 5) is performed. Specifically, chemical mechanical polishing (CMP) is performed on backside surface 1b of silicon carbide substrate 5, to remove a layer 6b including a process-damaged layer 6b1. More specifically, backside surface 5b of silicon carbide substrate 5 is oxidized with an oxidant, and backside surface 5b is mechanically polished using abrasive grains. The abrasive grains for the CMP are preferably made of a material softer than silicon carbide in order to reduce the surface roughness and a process-damaged layer. As the abrasive grains for the CMP, for example, colloidal silica or fumed silica is used. Preferably, an oxidant is added to a polishing liquid for the CMP. As the oxidant, for example, a hydrogen peroxide solution is used. Likewise, CMP is also performed on surface 5a of silicon carbide substrate 5. Accordingly, each of layer 6b including process-damaged layer 6b1 formed on the backside surface 1b side and a layer 6a including process-damaged layer 6a1 formed on the surface 1a side of silicon carbide substrate 5 is removed.

A polishing amount of a substrate by chemical mechanical polishing is usually about 1 μm. With the polishing amount of about 1 µm, however, it is difficult to completely remove process-damaged layer 6b1 formed on the backside surface 5b side of silicon carbide substrate 5. Thus, in this embodiment, not less than 1.5 µm of layer 6b including process-damaged layer 6b1 is removed on the backside surface 1b side of silicon carbide substrate 5. Preferably, in the step of removing layer 6b including process-damaged layer 6b1, not less than 2 µm, more preferably not less than 3 µm, of layer 6b including process-damaged layer 6b1 is removed. Likewise, not less than 1.5 µm of layer 6a including process-damaged layer 6a1 formed on the surface 5a side of silicon carbide substrate 5 is removed. Preferably, a removed amount of layer 6a including process-damaged layer 6a1 formed on the surface 5a side of silicon carbide substrate 5 is substantially equal to a removed amount of layer 6b including process-damaged layer 6b1 formed on the backside surface 5b side of silicon carbide substrate 5. Accordingly, the difference in stress between surface 5a and backside surface 5b of silicon carbide substrate 5 can be reduced, thereby reducing the warpage of silicon carbide substrate 5.

Preferably, the step of performing chemical mechanical polishing on backside surface 5b of silicon carbide substrate 5 includes a step of performing first chemical mechanical polishing at a first polishing rate, and after the step performing first chemical mechanical polishing, a step of performing second chemical mechanical polishing at a second polishing rate slower than the first polishing rate. For example, the first chemical mechanical polishing step is initially performed on backside surface 5b of silicon carbide substrate 5 using relatively large abrasive grains, to remove a large part of process-damaged layer 6b1 at a relatively fast polishing rate. Then, the second chemical mechanical polishing step is performed on backside surface 5b of silicon carbide substrate 5 using abrasive grains smaller than the abrasive grains used in the first chemical mechanical polishing step. It is noted that process-damaged layers 6a1 and 6b1 may be removed by a method other than the chemical mechanical polishing. Process-damaged layers 6a1 and 6b1 may be removed by dry etching, for example.

Referring back to FIG. 2, backside surface 1b of silicon carbide substrate 5 from which process-damaged layer 6b1 has been removed includes first central region IRb excluding first outer circumferential region ORb within 3 mm from the outer circumference. Preferably, when first central region IRb is divided into first square regions 4b each having a side of 250 µm, each of first square regions 4b has an arithmetic average roughness (Sa) of less than 0.2 nm. Preferably, after process-damaged layer 6b1 is removed, a mechanical polishing scratch is not formed on backside surface 1b of silicon carbide substrate 5.

Referring back to FIG. 3, surface 1a of silicon carbide substrate 5 from which process-damaged layer 6a1 has been removed includes second central region IRa excluding second outer circumferential region ORa within 3 mm from the outer circumference. Preferably, when second central region IRa is divided into second square regions 4a each having a side of 250 µm, each of second square regions 4a has an arithmetic average roughness (Sa) of less than 0.2 nm. Preferably, the difference between the arithmetic average roughness (Sa) of first square region 4b and the arithmetic average roughness (Sa) of second square region 4a is less than 0.15 nm, more preferably less than 0.1 nm.

Then, an oxygen concentration measuring step (S50: FIG. 5) is performed. Specifically, oxygen concentrations at five measurement sites of backside surface 5b of silicon carbide substrate 5 are measured by ESCA. The measurement sites of oxygen concentration are, for example, a site near the center of backside surface 5b of silicon carbide substrate 5, and four arbitrary sites in an annular region within first central region IRb excluding a region from the center to a position of one-half the radius. The four arbitrary sites are preferably located in a position in the vicinity of 0°, a position in the vicinity of 90°, a position in the vicinity of 180° and a position in the vicinity of 270°, for example, as seen from the direction of the normal of backside surface 5b.

As described above, process-damaged layer 6b1 includes a lot of oxygen as compared to the regions other than process-damaged layer 6b1 in silicon carbide substrate 5. Thus, by measuring the oxygen concentrations in backside surface 5b of silicon carbide substrate 5, the amount of process-damaged layer 6b1 remaining in backside surface 5b of silicon carbide substrate 5 can be estimated. If it is found that process-damaged layer 6b1 remaining is higher than a reference value as a result of the oxygen concentration measurements, additional CMP may be performed on backside surface 5b of silicon carbide substrate 5. When first central region IRb after the step of removing process-damaged layer 6b1 is divided into first square regions 4b each having a side of 250 µm, an oxygen concentration in each of first square regions 4b is not less than 5 atom % and less than 20 atom %. If process-damaged layer 6b1 is completely removed, a natural oxide film is formed on backside surface 5b of silicon carbide substrate 5, and thus it is believed that the oxygen concentration in the backside surface does not fall below 5 atom %.

Then, a step of cleaning silicon carbide substrate 5 with hydrofluoric acid is performed. Specifically, silicon carbide substrate 5 is immersed in a 10% hydrofluoric acid solution, for example, to remove a silicon dioxide film formed on each of surface 5a and backside surface 5b of silicon carbide substrate 5. Silicon carbide single-crystal substrate 1 described in the first embodiment is thus completed.

Next, the function and effect of the method of manufacturing silicon carbide single-crystal substrate 1 according to the third embodiment will be described.

According to the method of manufacturing silicon carbide single-crystal substrate 1 in accordance with the third embodiment, in the step of removing layer 6b including process-damaged layer 6b1, not less than 1.5 µm of layer 6b including process-damaged layer 6b1 is removed. When first central region IRb is divided into first square regions 4b each having a side of 250 µm, an oxygen concentration in each of first square regions 4b is not less than 5 atom % and less than 20 atom %. Accordingly, the roughness of backside surface 1b of silicon carbide single-crystal substrate 1 can be suppressed during epitaxial layer growth. As a result, vacuum adsorption failures of silicon carbide single-crystal substrate 1 can be reduced.

In addition, according to the method of manufacturing silicon carbide single-crystal substrate 1 in accordance with the third embodiment, each of first square regions 4b has an arithmetic average roughness (Sa) of less than 0.2 nm. The arithmetic average roughness (Sa) of both backside surface 1b and surface 1a of silicon carbide single-crystal substrate 1 can be reduced, thereby suppressing further warpage and deterioration of TTV of silicon carbide single-crystal substrate 1.

Moreover, according to the method of manufacturing silicon carbide single-crystal substrate 1 in accordance with the third embodiment, the step of removing layer 6b including process-damaged layer 6b1 includes the step of performing chemical mechanical polishing on backside surface 1b.

Accordingly, the arithmetic average roughness (Sa) of backside surface 1b of silicon carbide single-crystal substrate 1 can be effectively reduced.

Moreover, according to the method of manufacturing silicon carbide single-crystal substrate 1 in accordance with the third embodiment, the step of performing chemical mechanical polishing on first main surface 1b includes the step of performing first chemical mechanical polishing at the first polishing rate, and after the step of performing first chemical mechanical polishing, the step of performing second chemical mechanical polishing at the second polishing rate slower than the first polishing rate. When the polishing rate is fast, silicon carbide single-crystal substrate 1 can be polished in a short period of time as compared to when the polishing rate is slow, but it is difficult to sufficiently reduce the arithmetic average roughness (Sa) after the polishing. Thus, a large part of the process-damaged layer is initially removed in a short period of time at the relatively fast first polishing rate, and then backside surface 1b of silicon carbide single-crystal substrate 1 is polished at the second polishing rate slower than the first polishing rate, thereby reducing the final arithmetic average roughness (Sa) of backside surface 1b while shortening the overall polishing time.

Moreover, according to the method of manufacturing silicon carbide single-crystal substrate 1 in accordance with the third embodiment, surface 1a includes second central region IRa excluding the region within 3 mm from the outer circumference. When second central region IRa is divided into second square regions 4a having a side of 250 μm, each of second square regions 4a has an arithmetic average roughness (Sa) of less than 0.2 nm. The arithmetic average roughness (Sa) of both backside surface 1b and surface 1a of silicon carbide single-crystal substrate 1 can be reduced, thereby suppressing further warpage and deterioration of TTV of silicon carbide single-crystal substrate 1.

Moreover, according to the method of manufacturing silicon carbide single-crystal substrate 1 in accordance with the third embodiment, a mechanical polishing scratch is not formed on backside surface 1b. Accordingly, the roughness of backside surface 1b of silicon carbide single-crystal substrate 1 can be further reduced.

Fourth Embodiment

Next, a method of manufacturing silicon carbide epitaxial substrate 3 is described.

Figure 10:
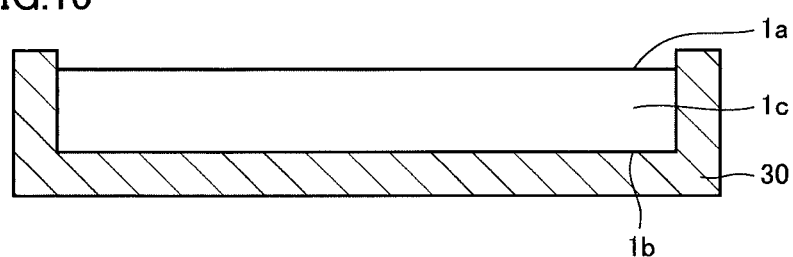
FIG. 10 is a schematic cross-sectional view schematically showing a method of manufacturing silicon carbide single-crystal substrate 1 according to a fourth embodiment of the present invention.

First, silicon carbide single-crystal substrate 1 is prepared by the method described in the third embodiment. Then, referring to FIG. 10, silicon carbide single-crystal substrate 1 is disposed in a recess formed in a susceptor 30. Silicon carbide single-crystal substrate 1 is disposed such that backside surface 1b of silicon carbide single-crystal substrate 1 is in contact with the bottom of the recess in susceptor 30 and surface 1a of silicon carbide single-crystal substrate 1 is exposed at the sides of susceptor 30. Silicon carbide single-crystal substrate 1 is placed in susceptor 30 such that the side surfaces of silicon carbide single-crystal substrate 1 face the sides of the recess formed in susceptor 30.

Then, silicon carbide epitaxial layer 2 is formed on surface 1a of silicon carbide single-crystal substrate 1. For example, a carrier gas including hydrogen ($H_2$), and a source material gas including monosilane ($SiH_4$), propane ($C_3H_8$), nitrogen ($N_2$) and the like are introduced onto surface 1a of silicon carbide single-crystal substrate 1. Silicon carbide epitaxial layer 2 is formed under such conditions that the growth temperature is not less than 1500° C. and not more than 1700° C., and the pressure is not less than $6\times10^3$ Pa and not more than $14\times10^3$ Pa. A dopant concentration in silicon carbide epitaxial layer 2 is about $5.0\times10^{15}$ $cm^{-3}$, for example. Silicon carbide epitaxial layer 2 has a thickness of about 10 μm, for example.

With silicon carbide epitaxial layer 2 now formed on surface 1a of silicon carbide single-crystal substrate 1, backside surface 1b of silicon carbide single-crystal substrate 1 becomes rough as compared to before silicon carbide epitaxial layer 2 is formed. After the step of forming silicon carbide epitaxial layer 2, each of first square regions 4b has an arithmetic average roughness (Sa) of less than 1.5 nm. If an abnormally grown portion such as particles exists on backside surface 1b of silicon carbide single-crystal substrate 1, the arithmetic average roughness (Sa) of first square region 4b is measured excluding first square region or regions 4b including the abnormally grown portion. Silicon carbide epitaxial layer 2 is thus manufactured.

According to the method of manufacturing the silicon carbide epitaxial substrate in accordance with the fourth embodiment, silicon carbide single-crystal substrate 1 is prepared by the method of manufacturing silicon carbide single-crystal substrate 1 according to the third embodiment. Silicon carbide epitaxial layer 2 is formed on surface 1a of silicon carbide single-crystal substrate 1. After the step of forming silicon carbide epitaxial layer 2, each of first square regions 4b has an arithmetic average roughness (Sa) of less than 1.5 nm. Accordingly, vacuum adsorption failures of silicon carbide epitaxial substrate 3 can be reduced.

Examples

1. Sample Preparations

First, silicon carbide single-crystal substrates 1 according to a sample 1 to a sample 6 were fabricated. Samples 1 to 5 are examples, while sample 6 is a comparative example. Silicon carbide single-crystal substrates 1 according to sample 1 to sample 6 were fabricated by the method described in the third embodiment, mainly except for the following points. Six silicon carbide substrates 5 were prepared by slicing a silicon carbide ingot. CMP was performed on backside surface 5b of each silicon carbide substrate 5. A polishing amount of backside surface 5b of each silicon carbide substrate 5 was 3.2 μm (sample 1), 3 μm (sample 2), 2.6 (sample 3), 1.9 μm (sample 4), 1.6 μm (sample 5) and 0.9 μm (sample 6). Silicon carbide substrates 5 according to sample 1 to sample 5 were cleaned with hydrofluoric acid after the CMP. Silicon carbide substrate 5 according to sample 6 was not cleaned with hydrofluoric acid after the CMP. Silicon carbide single-crystal substrates according to sample 1 to sample 6 were thus prepared. Then, silicon carbide epitaxial layer 2 was formed on surface 1a of silicon carbide single-crystal substrate 1 according to each of sample 1 to sample 6.

2. Measurements

Figure 11:
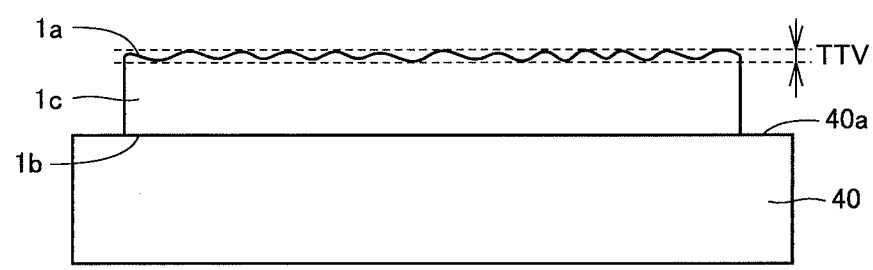
FIG. 11 is a schematic cross-sectional view to illustrate the definition of TTV (Total Thickness Variation).

First, the arithmetic average roughness (Sa) of and oxygen concentration in backside surface 1b of silicon carbide single-crystal substrate 1 according to each of sample 1 to sample 6 were measured. TTV of silicon carbide single-crystal substrate 1 was also measured. Referring to FIG. 11, the TTV refers to a value obtained by, when one main surface (backside surface 1b, for example) of silicon carbide single-crystal substrate 1 is being pressed against a flat reference surface 40a of a mount 40 serving as a reference, subtracting the distance from the reference surface to a minimum height of the other main surface (surface 1a, for example) from the distance from the reference surface to a maximum height of the other surface. Next, after silicon carbide epitaxial layer 2 was formed on surface 1a of silicon carbide single-crystal substrate 1, the arithmetic average roughness of backside surface 1b of silicon carbide single-crystal substrate 1 and the TTV of silicon carbide epitaxial substrate 3 were measured. A value of obtained by subtracting the TTV of silicon carbide single-crystal substrate 1 from the TTV of silicon carbide epitaxial substrate 3 after the formation of silicon carbide epitaxial layer 2 was provided as an amount of variation in TTV. The arithmetic average roughness of backside surface 1b was measured using a white light interferometric microscope (manufactured by Nikon Corporation: BW-D507). The TTV was measured using FlatMaster (registered trademark) made by Tropel.

The arithmetic average roughness (Sa) and oxygen concentration were measured at a total of five measurement sites, which were a site near the center of backside surface 5b of silicon carbide substrate 5, and four sites in an annular region, within first central region IRb excluding the region within 3 mm from the outer circumference of backside surface 5b, excluding a region from the center to a position of one-half the radius. The four sites in the annular region were located in a position in the vicinity of 0°, a position in the vicinity of 90°, a position in the vicinity of 180° and a position in the vicinity of 270°, for example, as seen from the direction of the normal of backside surface 5b. An average value of each of the arithmetic average roughnesses (Sa) and the oxygen concentrations at the five sites was calculated. A measurement area of the arithmetic average roughness (Sa) was a square region having a side of 250 µm. While it is ideal to measure the arithmetic average roughness (Sa) and oxygen concentration in all of first square regions 4b to confirm that each of first square regions 4b has an arithmetic average roughness (Sa) of not more than 0.2 nm and an oxygen concentration in each of first square regions 4b is not less than 5 atom % and less than 20 atom %, this is not realistic because it would take too much time. In the present specification, therefore, if the maximum arithmetic average roughness (Sa) is 0.2 nm and the maximum oxygen concentration is not less than 5 atom % and less than 20 atom % as a result of the measurements at the five sites described above, the arithmetic average roughness (Sa) is estimated to be 0.2 nm and the oxygen concentration is estimated to be not less than 5 atom % and less than 20 atom % in all of first square regions 4b. The same applies to the arithmetic average roughness (Sa) and oxygen concentration in second square regions 4a.

3. Results

Referring to Table 1 and FIGS. 12 to 15, the oxygen atom concentration in backside surface 1b of silicon carbide single-crystal substrate 1, the arithmetic average roughness (Sa) of backside surface 1b of silicon carbide single-crystal substrate 1 before the formation of epitaxial layer 2, the arithmetic average roughness (Sa) of backside surface 1b of silicon carbide single-crystal substrate 1 after the formation of epitaxial layer 2, and the amount of variation in TTV before and after the formation of epitaxial layer 2 are described.

Figure 12:
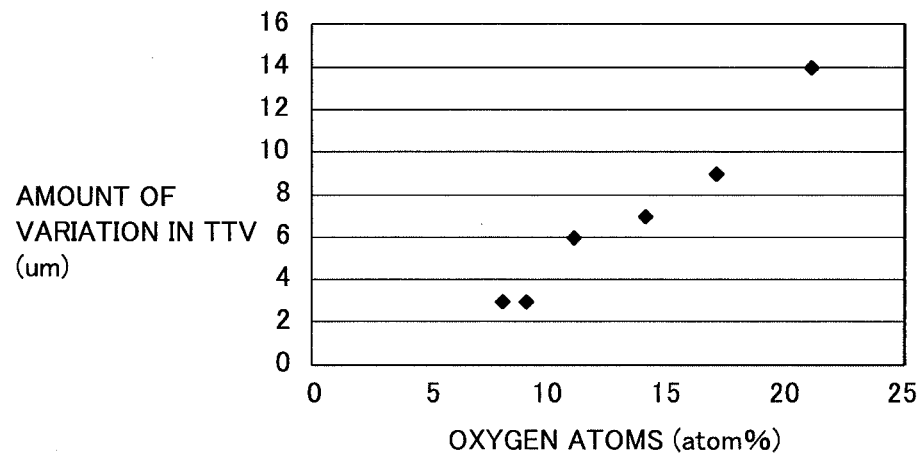
FIG. 12 is a diagram showing relation between oxygen concentration in backside surface 1b of silicon carbide single-crystal substrate 1 and an amount of variation in TTV.

Referring to FIG. 12, it can be seen that the oxygen atom concentration in backside surface 1b of silicon carbide single-crystal substrate 1 is highly correlated with the amount of variation in TTV. Specifically, as the oxygen atom concentration in backside surface 1b of silicon carbide single-crystal substrate 1 increases, the amount of variation in TTV increases. That is, it is believed that the amount of variation in TTV increases when a large amount of process-damaged layer 6b1 is remaining in backside surface 1b of silicon carbide single-crystal substrate 1.

Figure 13:
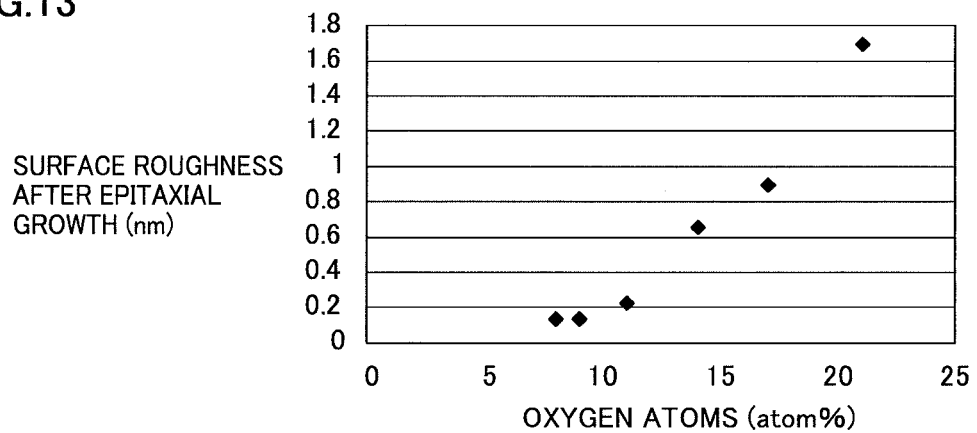
FIG. 13 is a diagram showing relation between the oxygen concentration in backside surface 1b of silicon carbide single-crystal substrate 1 and arithmetic average roughness (Sa) of backside surface 1b of silicon carbide single-crystal substrate 1 after the formation of an epitaxial layer.

Referring to FIG. 13, it can be seen that the oxygen atom concentration in backside surface 1b of silicon carbide single-crystal substrate 1 is highly correlated with the arithmetic average roughness (Sa) of backside surface 1b of silicon carbide single-crystal substrate 1 after the formation of epitaxial layer 2. Specifically, as the oxygen atom concentration in backside surface 1b of silicon carbide single-crystal substrate 1 increases, the arithmetic average roughness (Sa) of backside surface 1b of silicon carbide single-crystal substrate 1 after the formation of epitaxial layer 2 increases. That is, it is believed that the arithmetic average roughness (Sa) of backside surface 1b of silicon carbide single-crystal substrate 1 after the formation of epitaxial layer 2 increases when a large amount of process-damaged layer 6b1 is remaining in backside surface 1b of silicon carbide single-crystal substrate 1.

Figure 14:
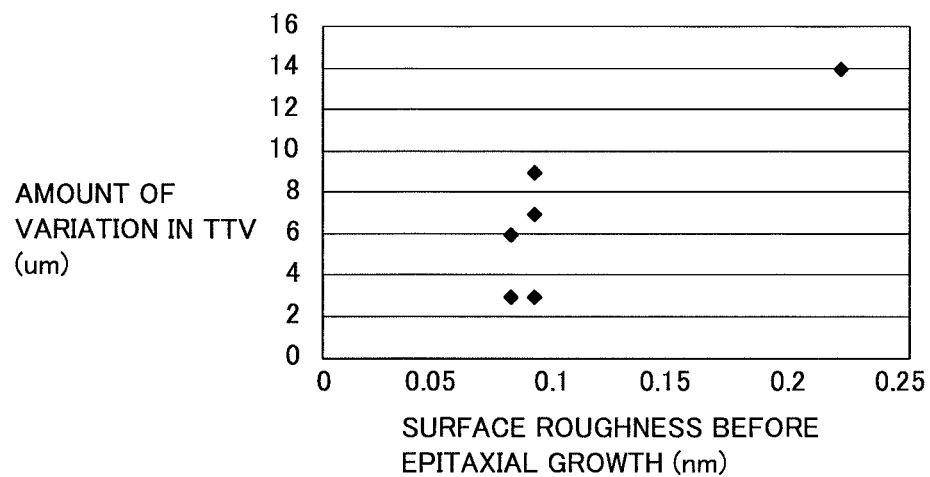
FIG. 14 is a diagram showing relation between arithmetic average roughness (Sa) of backside surface 1b of silicon carbide single-crystal substrate 1 before the formation of the epitaxial layer and the amount of variation in TTV.

Referring to FIG. 14 and Table 1, when the arithmetic average roughness (Sa) before the formation of epitaxial layer 2 was 0.22 nm (sample 6), the amount of variation in TTV was 14 µm, the highest value of the six samples. When the arithmetic average roughness (Sa) before the formation of epitaxial layer 2 was about not less than 0.08 nm and not more than 0.09 nm (samples 1 to 5), on the other hand, the amount of variation in TTV was about not less than 3 µm and not more than 9 µm.

Figure 15:
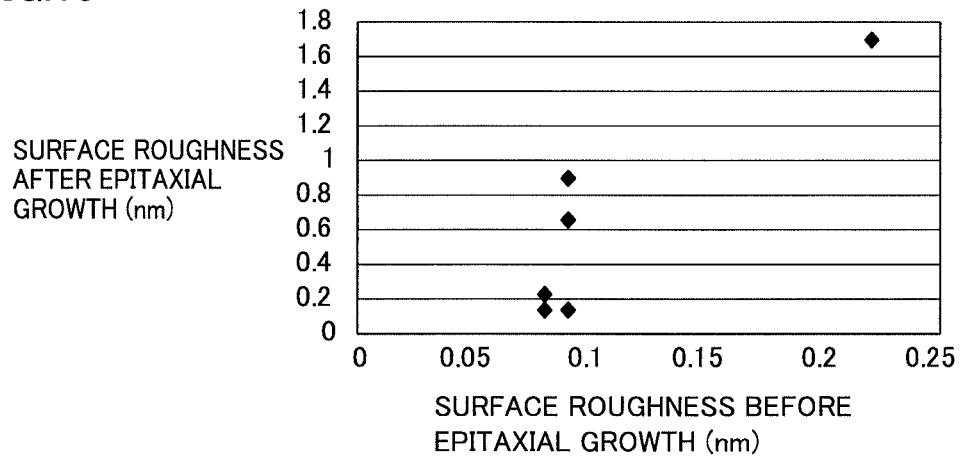
FIG. 15 is a diagram showing relation between the arithmetic average roughness (Sa) of backside surface 1b of silicon carbide single-crystal substrate 1 before the formation of the epitaxial layer and the arithmetic average roughness (Sa) of backside surface 1b of silicon carbide single-crystal substrate 1 after the formation of the epitaxial layer.

Referring to FIG. 15 and Table 1, when the arithmetic average roughness (Sa) before the formation of epitaxial layer 2 was 0.22 nm (sample 6), the arithmetic average roughness (Sa) after the formation of epitaxial layer 2 was 1.7 nm, the highest value of the six samples. When the arithmetic average roughness (Sa) before the formation of epitaxial layer 2 was about not less than 0.08 nm and not

TABLE 1

| Sample Number | Oxygen atoms [atom %] | Surface roughness Sa before epitaxial growth [nm] | Amount of variation in TTV before and after epitaxial growth [µm] | Surface roughness Sa after epitaxial growth [nm] | CMP polishing amount [µm] | Hydrofluoric acid cleaning |
|---|---|---|---|---|---|---|
| Sample 1 | 8 | 0.08 | 3 | 0.14 | 3.2 | Yes |
| Sample 2 | 9 | 0.09 | 3 | 0.14 | 3 | Yes |
| Sample 3 | 11 | 0.08 | 6 | 0.23 | 2.6 | Yes |
| Sample 4 | 14 | 0.09 | 7 | 0.66 | 1.9 | Yes |
| Sample 5 | 17 | 0.09 | 9 | 0.9 | 1.6 | Yes |
| Sample 6 | 21 | 0.22 | 14 | 1.7 | 0.9 | No | more than 0.09 nm (samples 1 to 5), on the other hand, the arithmetic average roughness (Sa) after the formation of epitaxial layer 2 was about not less than 0.14 nm and not more than 0.09 nm.

Based on the above results, it was confirmed that each silicon carbide single-crystal substrate 1 manufactured by setting the polishing amount of backside surface 5b of silicon carbide substrate 5 to not less than 1.6 μm and by cleaning silicon carbide substrate 5 with hydrofluoric acid (samples 1 to 5) had a polishing amount 0.9 μm, and had lower oxygen atom concentration and smaller arithmetic average roughness (Sa) of the backside surface than silicon carbide single-crystal substrate 1 manufactured without cleaning silicon carbide substrate 5 with hydrofluoric acid (sample 6). It was also confirmed that the arithmetic average roughness (Sa) of backside surface 1b of silicon carbide epitaxial substrate 3 according to each samples 1 to 5 was smaller than the arithmetic average roughness (Sa) of backside surface 1b of silicon carbide epitaxial substrate 3 according to sample 6. It was further confirmed that the amount of variation in TTV according to each of samples 1 to 5 was smaller than the amount of variation in TTV according to sample 6.

It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1 silicon carbide single-crystal substrate; 1a1, 1b1 outer circumference; 1a, 5a surface (second main surface); 1b, 5b backside surface (first main surface); 2 silicon carbide epitaxial layer; 3 silicon carbide epitaxial substrate; 4a second square region; 4b first square region; 5 silicon carbide substrate; 6a, 6b layer; 6a1, 6b1 process-damaged layer; 9 wire; 10 ingot; 20 support mount; 30 susceptor; 40 mount; 40a reference surface; G center of gravity; IRa second central region; IRb first central region; ORa second outer circumferential region; ORb first outer circumferential region; Oa, Ob center; x longitudinal direction.

The invention claimed is:

1. A silicon carbide single-crystal substrate including a first main surface and a second main surface opposite to the first main surface,
   the first main surface having a maximum diameter of not less than 100 mm,
   the first main surface including a first central region excluding a region within 3 mm from an outer circumference of the first main surface,
   when the first central region is divided into first square regions each having a side of 250 μm, each of the first square regions having an arithmetic average roughness (Sa) of less than 0.2 nm, and an oxygen concentration in each of the first square regions being not less than 5 atom % and less than 20 atom %.

2. The silicon carbide single-crystal substrate according to claim 1, wherein
   the second main surface includes a second central region excluding a region within 3 mm from an outer circumference of the second main surface, and
   when the second central region is divided into second square regions each having a side of 250 μm, each of the second square regions has an arithmetic average roughness (Sa) of less than 0.2 nm.

3. The silicon carbide single-crystal substrate according to claim 1, wherein
   a mechanical polishing scratch is not formed on the first main surface.

4. A silicon carbide epitaxial substrate comprising:
   the silicon carbide single-crystal substrate according to claim 1; and
   a silicon carbide epitaxial layer provided on the second main surface of the silicon carbide single-crystal substrate,
   each of the first square regions having an arithmetic average roughness (Sa) of less than 1.5 nm.

5. A method of manufacturing a silicon carbide single-crystal substrate, comprising the steps of:
   preparing a silicon carbide substrate including a first main surface and a second main surface opposite to the first main surface, by slicing a silicon carbide single crystal; and
   removing a layer including a process-damaged layer formed on the first main surface side of the silicon carbide substrate,
   after the process-damaged layer is removed, the first main surface including a first central region excluding a region within 3 mm from an outer circumference of the first main surface,
   the method further comprising the step of measuring oxygen concentration in the first central region,
   the first main surface having a maximum diameter of not less than 100 mm,
   in the step of removing a layer including a process-damaged layer, not less than 1.5 μm of the layer including the process-damaged layer being removed,
   when the first central region is divided into first square regions each having a side of 250 μm, an oxygen concentration in each of the first square regions being not less than 5 atom % and less than 20 atom %.

6. The method of manufacturing a silicon carbide single-crystal substrate according to claim 5, wherein
   each of the first square regions has an arithmetic average roughness (Sa) of less than 0.2 nm.

7. The method of manufacturing a silicon carbide single-crystal substrate according to claim 5, wherein
   the step of removing a layer including a process-damaged layer includes the step of performing chemical mechanical polishing on the first main surface.

8. The method of manufacturing a silicon carbide single-crystal substrate according to claim 7, wherein
   the step of performing chemical mechanical polishing on the first main surface includes the steps of
   performing first chemical mechanical polishing at a first polishing rate, and
   after the step of performing first chemical mechanical polishing, performing second chemical mechanical polishing at a second polishing rate slower than the first polishing rate.

9. The method of manufacturing a silicon carbide single-crystal substrate according to claim 5, wherein
   the second main surface includes a second central region excluding a region within 3 mm from an outer circumference of the second main surface, and
   when the second central region is divided into second square regions each having a side of 250 μm, each of the second square regions has an arithmetic average roughness (Sa) of less than 0.2 nm.

10. The method of manufacturing a silicon carbide single-crystal substrate according to claim 5, wherein
   a mechanical polishing scratch is not formed on the first main surface.

11. A method of manufacturing a silicon carbide epitaxial substrate, comprising the steps of:
   preparing a silicon carbide single-crystal substrate by the method of manufacturing a silicon carbide single-crystal substrate according to claim 5; and
   forming a silicon carbide epitaxial layer on the second main surface of the silicon carbide single-crystal substrate,
   after the step of forming a silicon carbide epitaxial layer, each of the first square regions having an arithmetic average roughness (Sa) of less than 1.5 nm.

* * * * *